United States Patent
Shao et al.

(10) Patent No.: US 6,576,980 B1
(45) Date of Patent: Jun. 10, 2003

(54) SURFACE TREATMENT ANNEAL OF HYDROGENATED SILICON-OXY-CARBIDE DIELECTRIC LAYER

(75) Inventors: Huili Shao, Orlando, FL (US); Kurt G. Steiner, Orlando, FL (US); Susan C. Vitkavage, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/451,053

(22) Filed: Nov. 30, 1999

(51) Int. Cl.[7] ............................................. H01L 23/58
(52) U.S. Cl. ...................... 257/632; 257/642; 438/765; 438/778; 438/781
(58) Field of Search ................... 438/778, 781, 438/765; 257/632, 642; 427/515, 534, 563, 568, 226; 428/447

(56) References Cited

U.S. PATENT DOCUMENTS

| | | | |
|---|---|---|---|
| 4,981,820 A | 1/1991 | Renlund et al. | 501/39 |
| 5,180,694 A | 1/1993 | Renlund et al. | 501/12 |
| 5,530,581 A * | 6/1996 | Cogan | 359/265 |
| 5,567,661 A | 10/1996 | Nishio et al. | 438/631 |
| 5,736,425 A | 4/1998 | Smith et al. | 438/778 |
| 5,847,443 A | 12/1998 | Cho et al. | 257/632 |
| 5,889,211 A | 3/1999 | Maudie et al. | 73/720 |
| 5,950,101 A | 9/1999 | Yano et al. | 438/618 |
| 5,965,271 A | 10/1999 | Grabbe et al. | 428/446 |
| 6,140,252 A * | 10/2000 | Cho et al. | 438/781 |

* cited by examiner

*Primary Examiner*—Olik Chaudhuri
*Assistant Examiner*—Hsien-Ming Lee
(74) *Attorney, Agent, or Firm*—James H. Beusse; Beusse Brownlee Bowdoin & Wolter, P.A.

(57) ABSTRACT

A method of surface treating a surface and semiconductor article is disclosed. A deposited surface layer on a substrate, such as a semiconductor surface, is treated and annealed within an alkyl environment of a chemical vapor deposition chamber to passivate the surface layer by bonding with the silicon and attaching alkyl terminating chemical species on the surface of the surface layer to aid in dehydroxylating the surface. The surface layer comprises a silicon-oxy-carbide surface layer having a carbon content ranging from about 5% to about 20% at the molecular level and a dielectric constant of about 2.5 to about 3.0.

14 Claims, 4 Drawing Sheets

015
SURFACE TREATMENT ANNEAL OF HYDROGENATED SILICON-OXY-CARBIDE DIELECTRIC LAYER

FIELD OF THE INVENTION

This invention relates to the passivation of dielectric surfaces of semiconductors, and more particularly, this invention relates to a method of treating a hydrogenated silicon-oxy-carbide dielectric surface layer to dehydroxylate the dielectric surface layer.

BACKGROUND OF THE INVENTION

One area of interest in semiconductor manufacture has been the use of hydrogenated silicon-oxy-carbide glass and the associated methods to form a low dielectric constant inter-metal dielectric constant film.

Much study has already been accomplished with the use of the reactions between silicon, carbon and oxygen, especially for the use of "nicalon" fibers and composite ceramics. Some of these products have been used in fiber optic applications. An example is the silicon-oxy-carbide glass method of preparation and associated product disclosed in U.S. Pat. No. 5,180,694 to Renlund et al., the disclosure which is hereby incorporated by reference in its entirety. It has been found that these types of materials can also be used in the semiconductor industry.

These low dielectric constant (low k) inter-metal dielectrics are applicable with silicon-oxy-carbide glass and, reduce parasitic capacitance. Amorphous, hydrogenated silicon-oxy-carbide ($\alpha$-SiOC:H) has been found to be a viable low k material for advanced integrated circuit technology applications, such as with copper. Chemical vapor deposition (CVD) of $\alpha$-SiOC:H glass found a mixture of alkyl-silane and nitrous-oxide has a dielectric constant (k) of about 2.5 to 3.0, as compared to conventional SiO2 with a dielectric constant $\geq 3.9$. The k value of the $\alpha$-SiOC:H film is directly proportional to the carbon content where a higher carbon content yields a lower k. A higher carbon content creates problems with conventional lithography pattern transfer because of a reduced chemical etch selectivity between the $\alpha$-SiOC:H and the polymer photo resist material. Another prior art method for reducing the dielectric constant (k) is to make it porous, basically encapsulating voids in the $\alpha$-SiOC:H film. This results in a suitable low k film, with a carbon content of about 5–20 atomic percent. However, dangling sites cause the film's dielectric properties to be unstable.

Prior art attempts to correct the unstable dielectric properties have included the excessively long curing in oxygen and/or nitrogen, or capping the porous $\alpha$-SiOC:H film with a barrier, such as silicon nitride. The long cure (2–5 hours) is expensive in terms of cycle time and additional facility requirements. Furthermore, the films are not completely stable because bond sites are not fully passivated. The barrier films have a higher dielectric constant (typically >>4.0) which increases the effective k.

There has been some chemical treatment for silica-containing glass-surface using strained siloxane rings, such as disclosed in U.S. Pat. No. 5,965,271 to Grabbe et al., the disclosure which is hereby incorporated by reference in its entirety. However, the 271 disclosure is directed to a more conventional silica-containing glass surface and not the silicon-oxy-carbide semiconductor surface layer as in the present invention.

SUMMARY OF THE INVENTION

It is therefore an object of the present invention to passivate a deposited polysilicon-oxy-carbide dielectric surface layer to dehydroxylate the dielectric surface layer without impairing its function.

The present invention cures the $\alpha$-SiOC:H layer in an alkyl environment, thus effectively changing the Si—OH, SiH and SI—O into $Si_s$ ($CH_3$). This passivation cure is performed insitu in a plasma enchanced (PE-) CVD reactor by dissociating methane, acetylene or any other alkyl component, such as hexamethyldisilane (HMDS) or methyltriacetoxysilane (MTAS).

In still another method aspect of the present invention, the dielectric surface layer deposited over a semiconductor substrate is treated in an alkyl environment. The dielectric surface layer comprises a deposited silicon-oxy-carbide layer having a carbon content ranging from about 5% to about 20% at the molecular level and a dielectric constant of about 2.5 to about 3.0. The method comprises the steps of positioning the semiconductor substrate within a chemical vapor deposition chamber and heating the dielectric surface layer. The dielectric surface layer is annealed within an alkyl environment of the chemical vapor deposition chamber to passivate the dielectric surface layer while bonding with the silicon an attaching alkyl terminating chemical species on the dielectric surface layer to aid in dehydroxylating the dielectric surface layer.

The step of heating further comprises the step of heating with a plasma within the chemical vapor deposition chamber. The heating step with a plasma can occur at a power of about 100 to about 500 watts. A radio frequency induced current can be generated and typically is about 12 to about 14 MHz. The annealing can occur within a vacuum environment of about 1 to about 10 Torr.

In still another aspect of the present invention, a semiconductor article includes a semiconductor substrate and deposited polysilicon-oxy-carbide dielectric surface layer having a carbon content ranging from about 5% to about 20% at the molecular level and a passivated surface layer has a terminating chemical species that is substantially free of hydroxyl and formed by heating the silicon-oxy-carbide dielectric surface layer within a chemical vapor deposition chamber and contacting the surface layer with an alkyl to bond molecules via Si—O—Si chains and dehydroxylate the surface layer. The alkyl group in one aspect of the present invention can be selected from the group consisting of: acetylene, methane, hexamethyldisilane and methyltriacetoxysilane to bond molecules via Si—O—Si chains and dehydroxylate the surface. The hexarmethyldisilane and the methyltriacctoxysilane are about 1% to about 30% concentration.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because it now allows the curing of an α-SiOC:H, silicon-oxy-carbide dielectric surface layer in an alkyl environment to allow the passivation of the Si—OH, SiH and SI—O as $Si_s(CH_3)_3$. The passivation cure is performed insitu in a plasma enhanced (PECVD) reactor by dissociating methane, acetylene or any other alkyl component, such as hexamethyldisilane (HMDS) or methyltriacetoxysilane (MTAS).

Figure 2:
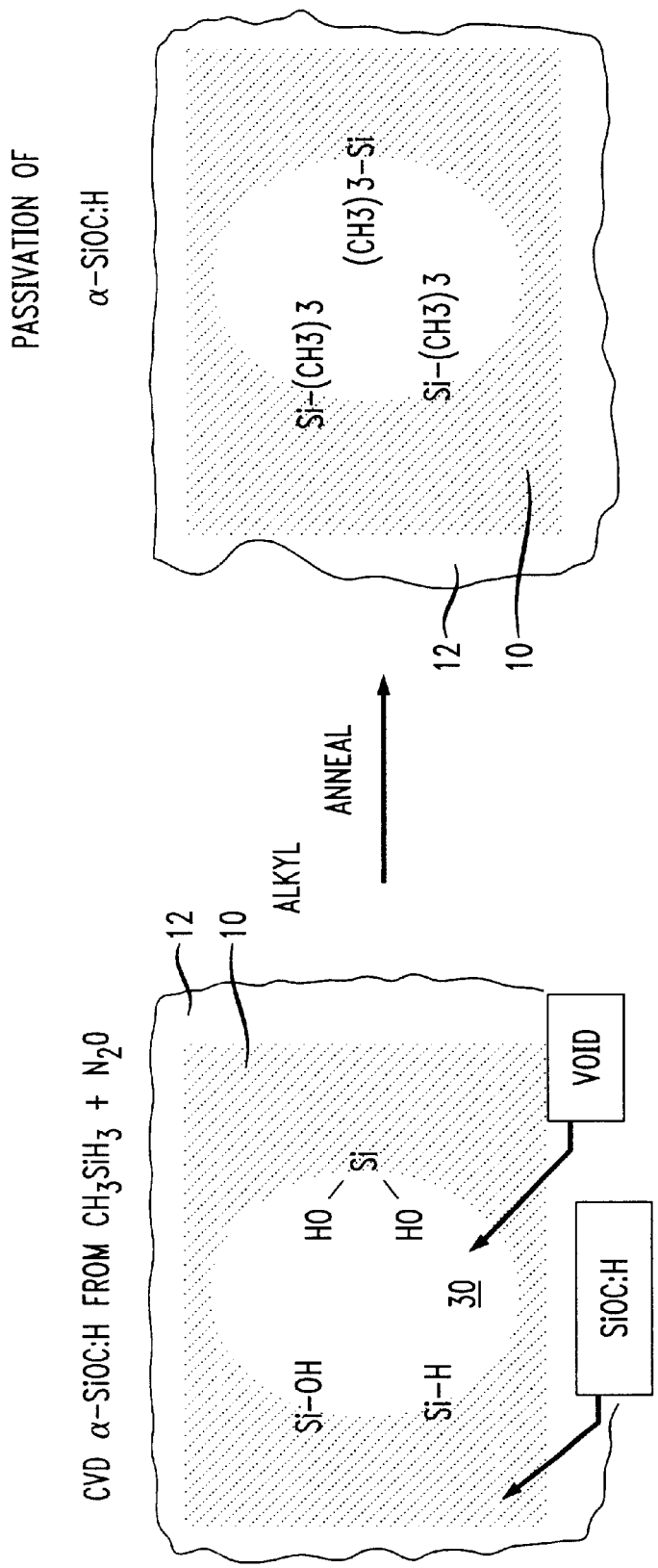
FIG. 2 is a schematic drawing showing a silicon-oxy-carbide dielectric surface layer that has an alkyl anneal to fill voids and dehydroxylate the surface layer.

Typically, the dielectric surface layer of the present invention comprises a silicon-oxy-carbide surface layer 10 deposited over a semiconductor substrate or other base 12 (FIG. 2). The silicon-oxy-carbide surface layer could be the substrate for subsequent layering. The silicon-oxy-carbide (α-SIOC:H) has a carbon content ranging from about 5% to about 20% at the molecular level and a dielectric constant of about 2.5 to about 3.0. Although 5% to about 20% typically is the range of carbon content, it is possible to have a carbon content as high as 40% in special cases. However, a 40% carbon concentration is not as desirable because it becomes more difficult to integrate the dielectric surface layer with die other processes.

Figure 1:
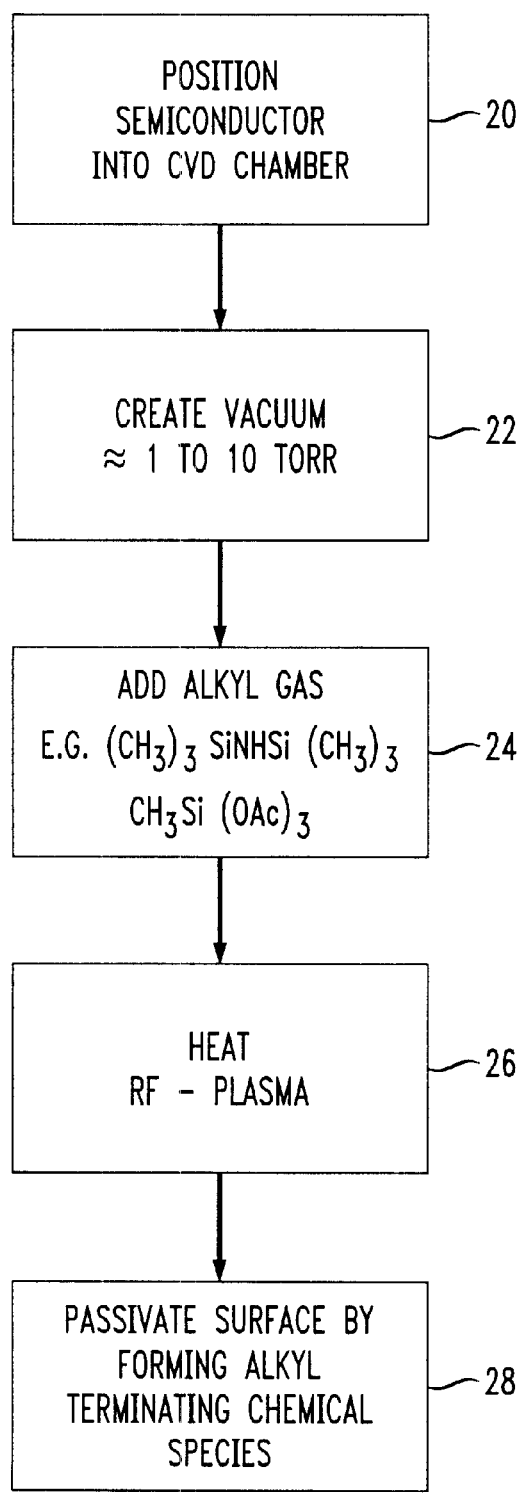
FIG. 1 is an overall flow chart showing the sequence of steps used for treating the silicon-oxy-carbide dielectric surface layer in accordance with the present invention.
Figure 5:
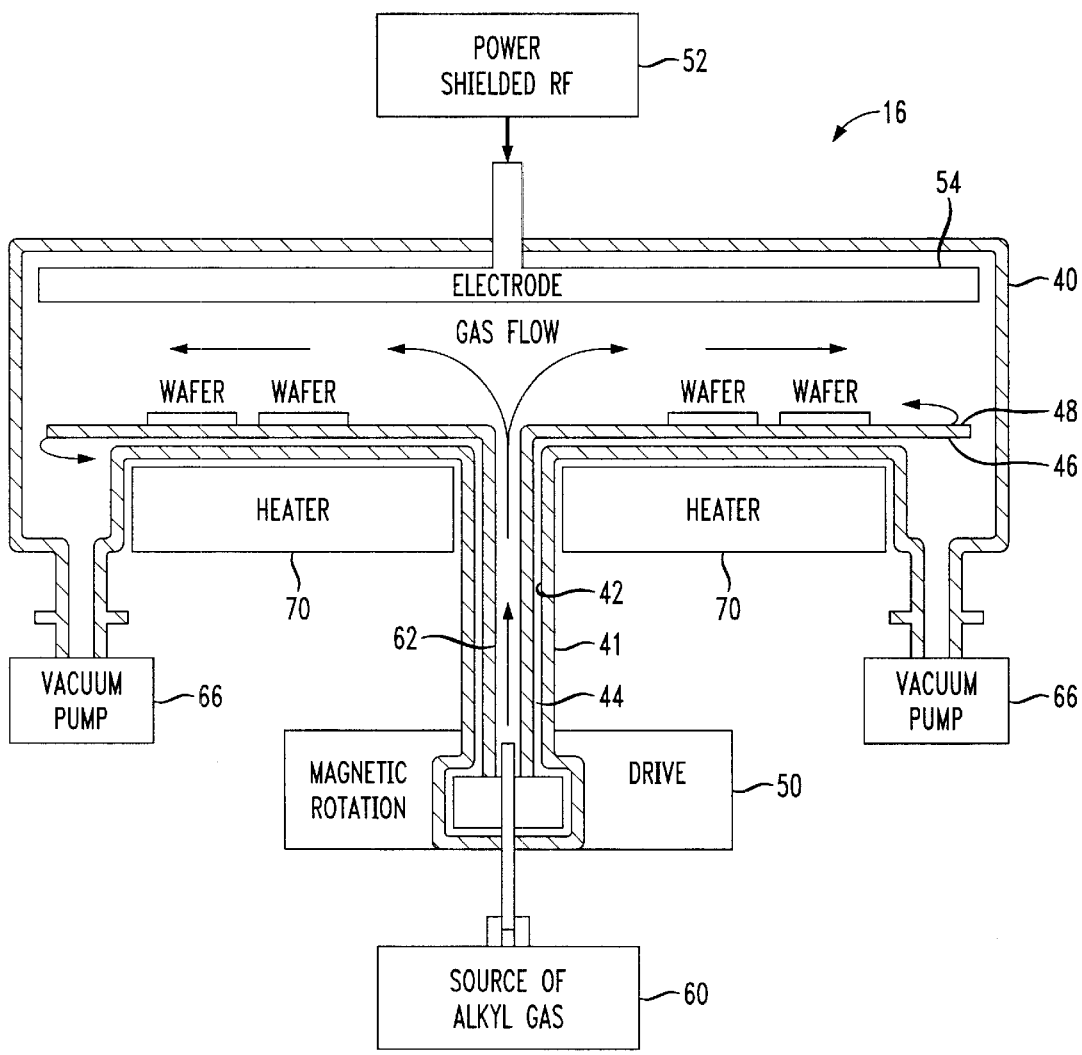
FIG. 5 is a schematic, side sectional view of a chemical vapor deposition chamber that can be used with the present invention.

FIG. 1 illustrates the basic method of the present invention where at block 20, the semiconductor substrate 10 has a silicon-oxy-carbide dielectric surface layer 12 of the present invention and is positioned into a chemical vapor deposition chamber. Typically the substrate 10 and surface layer 12 are formed as a wafer (FIG. 5). Naturally, one or more wafers can be placed into a chemical vapor deposition chamber and it is typical that a large plurality of wafers hare placed into a chamber as shown in the chemical vapor deposition chamber 16 of FIG. 5.

A vacuum is created, typically on the order of about 1 to 10 Torr as shown in block 22. An alkyl environment is created within the chemical vapor deposition chamber by injecting the alkyl gas. Although many different types of alkyls can be used, acetylene, methane, hexamethyldisicane, (CH3), 3SiNaSi (CH3)3 and methyltriacetoxysilane, CH3SI (Oac)3 are advantageous. A plasma is created to heat the dielectric surface layer 12, such as with a radio frequency that creates a plasma (block 26). The radio frequency induced current is about 12 MHz to about 14 MHz but could be a slow as 200 kHz. The surface layer is passivated by forming an alkyl terminating chemical species (block 28). It is not desirable to heat above 450 to 500° C. In order to break the molecules of the alkyl and break the hydroxide groups formed on the voids of the semiconductor layer, it is often necessary to induce the plasma with a radio frequency power as is well known to those skilled in the art. Typically the plasma power is about 100 to about 500 watts. Typical flow of an alkyl material will be on the order of about a liter per minute, usually sufficient enough to fill in the pores that are originally formed in the semiconductor silicon-oxy-carbine surface layer.

FIG. 2 illustrates the voids (or pores) 30 that are formed in the dielectric surface with an —H atom and —OH group connected to the silicon (Si). The alkyl anneal occurs by the passivation anneal of the SiOC dielectric surface layer as shown in FIG. 2. The plasma energy and heat induces the breaking of the appropriate bonds an the forming of the termination chemical species into the Si—O—Si bonds with $(CH_3)_3$.

Figure 3:
FIG. 3 is a schematic drawing showing the annealing of a silicon-oxy-carbide dielectric surface layer with hexamethyldisilane.
Figure 4:
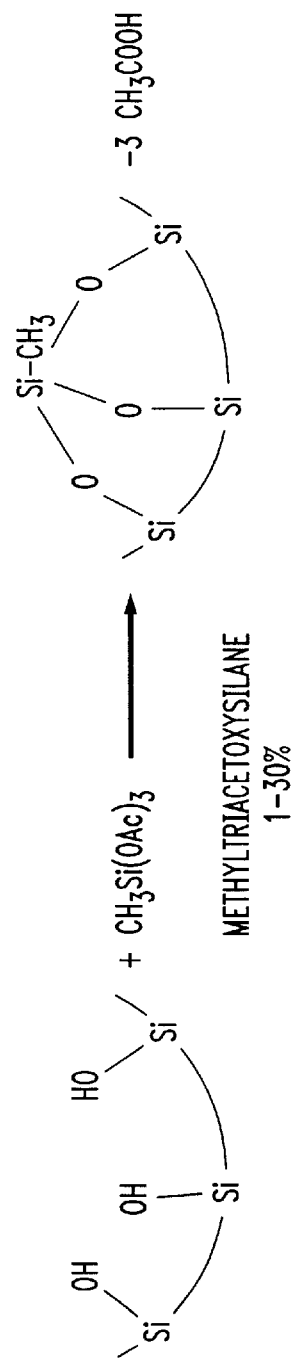
FIG. 4 is a schematic drawing showing the annealing of the silicon-oxy-carbide dielectric surface layer with methyltriacetoxysilane.

FIGS. 3 and 4 illustrates in schematic diagrams the uses of hexamethyldisilane and methyltriacetoxysilane as the alkyl component, where the voids 30 having the Si—OH and SiH groups are replaced with an Si—O—Si and $CH_3(_3)$ or $CH_3$ groupings. Typically, the hexamethyldisilane and the methyltriacetoxysilane is at a concentration of about 1% to about 30% during the anneal passivation depending on the carbon content and other factors as determined by those skilled in the art.

FIG. 5 illustrates an example of a plasma enhanced chemical vapor deposition chamber 16 used with the present invention. A housing 40 is substantially cylindrically configured and includes a centrally located housing 41 having a bore 42. The bore 42 contains a hollow drive spindle 44 with a circular configured wafer platen holder 46 that forms a substantially circular configured water holding top surface 48. A magnetic rotation drive 50 is operatively connected to the drive spindle 44 and rotates the wafer platen holder 46 as the drive 50 rotates the spindle 44. A power shielded radio frequency generator source 52 connects into an electrode 54 that extends through the top surface of the chamber 16 and provides the heating necessary to allow plasma generation within the chamber. A source of alkyl gas 60 provides an alkyl gas to the chamber, which is forced into the chamber 16 via a gas orifice 62 contained in the hollow drive spindle 44. Vacuum pumps 66 withdraw vacuum from the chamber 16. Heaters 70 are placed under the chamber 16 and also provide additional heat for heating the wafers W.

In operation, the waters W formed of the substrate 10 and silicon-oxy-carbide surface layer 12 are placed onto the wafer platen holder 46. Gas flow in the form of the desired alkyl is forced upward through the drive spindle 44 into the chamber 16. The vacuum pump 66 also withdraws all ambient air from the chamber before gas flow. Wafers are initially heated through the heaters 70. The magnetic rotation drive 50 rotates the wafers W within the chamber and the power shielded RF generator 52 supplies the necessary power to the electrode 54 to form the plasma and allow the passivation layer to be formed as described before.

FIGS. 2–4 illustrates a semiconductor article that comprises a silicon-oxy-carbide dielectric surface layer 12 deposited over a substrate 10 where the surface layer 12 has a carbon content ranging from about 5% to about 20% at the molecular level and a dielectric constant of about 2.5 to about 3.0. A passivating surface layer 12a is formed on the silicon-oxy-carbide and has a terminating chemical species that is substantially free of hydroxyl and formed by heating the silicon-oxy-carbide substrate within the chemical vapor deposition chamber and contacting the substrate with an alkyl selected from the group consisting of: acetylene, methane, hexamethyldisilane and methyltriacetoxysilane to bond molecules via Si—O—Si chains and dehydroxylate the surface. The hexamethyldisilane and methyltriaceoxysilane are about 1% to about 30% concentration and are illustrated diagrammatically in FIGS. 3 and 4.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of treating a dielectric surface layer on a substrate, wherein the dielectric surface layer comprises a deposited silicon-oxy-carbide dielectric surface layer having a carbon content ranging from about 5% to about 20% at the molecular level and a dielectric constant of about 2.5 to about 3.0, the method comprising the steps of:

positioning the substrate within a chemical vapor deposition chamber; heating the dielectric surface layer; and annealing the dielectric surface layer within an alkyl environment of the chemical vapor deposition chamber to passivate the dielectric surface layer to aid in dehydroxylating the dielectric surface layer.

2. A method according to claim 1, wherein the step of heating further comprises the step of heating with a plasma within-the chemical vapor deposition chamber.

3. A method according to claim 2, and further comprising the step of heating with a plasma power of about 100 to about 500 watts.

4. A method according to claim 1, and further comprising the step of heating the dielectric surface layer by generating a radio frequency induced current.

5. A method of treating a dielectric surface layer on a semiconductor substrate, wherein the dielectric surface layer comprises a deposited silicon-oxy-carbide dielectric surface layer having a carbon content ranging from about 5% to about 20% at the molecular level and a dielectric constant of about 2.5 to about 3.0, the method comprising of:

positioning the substrate within a plasma enhanced, chemical vapor deposition chamber;

heating the dielectric surface layer within the chemical vapor deposition chamber with a plasma and a radio frequency induced current of about 12 MHz to about 14 MHz; and annealing the dielectric surface layer within an alkyl environment of the chemical vapor deposition chamber and within a vacuum environment of about 1 to about 10 Torr to passivate the dielectric surface layer by bonding with the silicon an attaching alkyl terminating chemical species on the dielectric surface layer to aid in the dehydroxylating the dielectric surface layer.

6. A method according to claim 5, and further comprising the step of heating with a plasma power of about 100 to about 500 watts.

7. A method of treating a dielectric surface layer deposited on a semiconductor substrate, wherein the dielectric surface layer comprises a deposited silicon-oxy-carbide dielectric surface layer, the method comprising the steps of:

positioning the substrate within a chemical vapor deposition chamber;

heating the dielectric surface layer; and annealing the dielectric surface layer within an alkyl environment of the chemical vapor deposition chamber within a vacuum environment of about 1 to about 10 Torr having one of either hexamethyldisilazane of about 1 to about 30% concentration or methyltriacetoxysilane of about 1 to about 30 percent concentration to passivate the dielectric surface layer by bonding with the silicon an attaching alkyl terminating chemical species on the dielectric surface layer to aid in dehydroxylating the dielectric surface layer.

8. A method according to claim 7, where in the dielectric surface comprises a deposited silicon-oxy-carbide dielectric surface layer having a carbon content ranging from about 5% to about 20% at the molecular level and a dielectric constant of about 2.5 to about 3.0.

9. A method according to claim 7, wherein the step of heating further comprises the step of heating with a plasma within the chemical vapor deposition chamber.

10. A method according to claim 9, and further comprising the step of heating with a plasma power of about 100 to about 500 watts.

11. A method according to claim 7, and further comprising the step of heating the dielectric surface layer by generating a radio frequency induced current.

12. A semiconductor article comprising:

a semiconductor substrate and a deposited silicon-oxy-carbide dielectric surface layer having a carbon content ranging from about 5% to about 20% at the molecular level and a dielectric constant of about 2.5 to about 3.0 and a passivating dielectric surface layer having a terminating chemical species that is substantially free of hydroxyl and formed by heating the silicon-oxy-carbide dielectric surface layer within a chemical vapor deposition chamber within a vacuum environment of about 1 to about 10 Torr and contacting the dielectric surface layer with an alkyl to bond molecules via Si—O—Si chains to dehydroxylate the dielectric surface layer.

13. A semiconductor article comprising:

a semiconductor substrate and a deposited silicon-oxy-carbide dielectric surface layer having a carbon content ranging from about 5% to 20% at the molecular level and a dielectric constant of about 2.5 to about 3.0 and a passivating dielectric surface layer having a terminating chemical species that is substantially free of hydroxyl and formed by heating the silicon-oxy-carbide dielectric surface layer within a chemical vapor deposition chamber and contacting the dielectric surface layer with an alkyl methyltriacetoxysilane to bond molecules via Si—O—Si chains to dehydroxylate the surface dielectric surface layer.

14. A semiconductor article according to claim 13, wherein said hexamethyldisilane and methyltriacetoxysilane are at about 1 to about 30 percent concentration during passivation.

* * * * *